(12) United States Patent
Okabe et al.

(10) Patent No.: US 11,430,857 B2
(45) Date of Patent: Aug. 30, 2022

(54) DISPLAY DEVICE WITH EDGE COVER HAVING SLIT PARTIALLY SURROUNDING DISPLAY AREA

(71) Applicant: SHARP KABUSHIKI KAISHA, Sakai (JP)

(72) Inventors: Tohru Okabe, Sakai (JP); Shinsuke Saida, Sakai (JP); Shinji Ichikawa, Sakai (JP); Hiroki Taniyama, Sakai (JP); Ryosuke Gunji, Sakai (JP); Takeshi Yaneda, Osaka (JP); Yoshihiro Nakada, Yonago (JP); Hiroharu Jinmura, Yonago (JP); Akira Inoue, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 142 days.

(21) Appl. No.: 17/040,904

(22) PCT Filed: Mar. 30, 2018

(86) PCT No.: PCT/JP2018/013823
§ 371 (c)(1),
(2) Date: Sep. 23, 2020

(87) PCT Pub. No.: WO2019/187074
PCT Pub. Date: Oct. 3, 2019

(65) Prior Publication Data
US 2021/0013297 A1 Jan. 14, 2021

(51) Int. Cl.
*H01L 27/32* (2006.01)

(52) U.S. Cl.
CPC ...... *H01L 27/3276* (2013.01); *H01L 27/3262* (2013.01)

(58) Field of Classification Search
CPC ........................ H01L 27/3276; H01L 27/3262
See application file for complete search history.

(56) References Cited

U.S. PATENT DOCUMENTS

| 9,478,594 B2* | 10/2016 | Odaka | H01L 51/5203 |
| 2010/0171105 A1 | 7/2010 | Kim et al. | |
| 2015/0036299 A1* | 2/2015 | Namkung | G02F 1/133345 361/749 |
| 2015/0102376 A1* | 4/2015 | Toya | H01L 51/5246 257/98 |
| 2016/0365398 A1* | 12/2016 | Kim | H01L 27/3276 |
| 2017/0278912 A1* | 9/2017 | Kim | H01L 27/3262 |
| 2018/0061917 A1* | 3/2018 | Kim | H01L 51/0097 |

FOREIGN PATENT DOCUMENTS

JP          2010-161058 A          7/2010

* cited by examiner

*Primary Examiner* — Lex H Malsawma
(74) *Attorney, Agent, or Firm* — ScienBiziP, P.C.

(57) ABSTRACT

The display device includes a non-display area. The non-display area includes: a slit formed in an edge cover; a first conductive layer formed in the same layer as an anode, and being in contact with a cathode; and a second conductive layer formed in the same layer as a capacitance electrode and provided to overlap the slit.

15 Claims, 12 Drawing Sheets

DISPLAY DEVICE WITH EDGE COVER HAVING SLIT PARTIALLY SURROUNDING DISPLAY AREA

TECHNICAL FIELD

The present invention relates to a display device.

BACKGROUND ART

Patent Document 1 discloses an organic light-emitting diode (OLED). In the OLED, a planarization film is provided below an anode (a pixel electrode), and the anode and a drain electrode of a thin-film transistor (TFT) are connected together through a contact hole formed in the planarization film.

CITATION LIST

Patent Literature

[Patent Document 1] Japanese Unexamined Patent Application Publication No. 2010-161058 (published on Jul. 22, 2010)

SUMMARY OF INVENTION

Technical Problem

Unfortunately, in the configuration of Patent Document 1, the planarization film is costly to form.

SUMMARY

A display device according to an aspect of the disclosure includes: a display area including a plurality of sub-pixels each of which has a sub-pixel circuit including a transistor; and a non-display area that is a non-formation area disposed around the display area and having an end on which a terminal is formed. The display area includes: a first metal layer including an electrode positioned in a lower layer of the sub-pixel circuit; a first inorganic insulating film formed above the first metal layer; a second metal layer formed above the first inorganic insulating film, and including an electrode above the first metal layer, the electrode being included in electrodes in the sub-pixel circuit; a second inorganic insulating film formed above the second metal layer; a first electrode formed above the second inorganic insulating film, the first electrode being included in the electrodes in the sub-pixel circuit, and formed above the second metal layer, and being shaped into an island for each of the sub-pixels; an organic insulating film formed above the second inorganic insulating film to cover an edge of the first electrode, and exposing the first electrode; a light-emitting layer formed above the first electrode; and a second electrode formed across the light-emitting layer from the first electrode, the second electrode being formed across the sub-pixels. The non-display area includes: a slit formed in the edge cover to partially surround an outer periphery of the display area; a first conductive layer formed in the same layer as, and separated from, the first electrode, the first conductive layer being in contact with the second electrode at the slit; a second conductive layer formed in the second metal layer, and provided to overlap the slit across from the second inorganic insulating film; and a plurality of routed wires including a wire formed in the first metal layer. The routed wires extend from the non-display area to the display area to intersect with the first conductive layer and the second conductive layer at the slit, and are electrically connected to a wire of the display area, and at the slit, the routed wires overlap the first conductive layer across from the first inorganic insulating film, the second conductive layer, and the second inorganic insulating film.

Advantageous Effects of Invention

An aspect of the disclosure eliminates the need of a planarization film, and thus is effective in cost reduction.

DESCRIPTION OF EMBODIMENTS

First Embodiment

Outline of Display Device

In the description below, the term "same layer" means that constituent features are formed in the same process (in the same film forming process). The term "lower layer (or layer below)" means that a constituent feature is formed in a previous process before a comparative layer is formed. The term "upper layer (or layer above)" means that a constituent feature is formed in a successive process after a comparative layer is formed.

Figure 1:
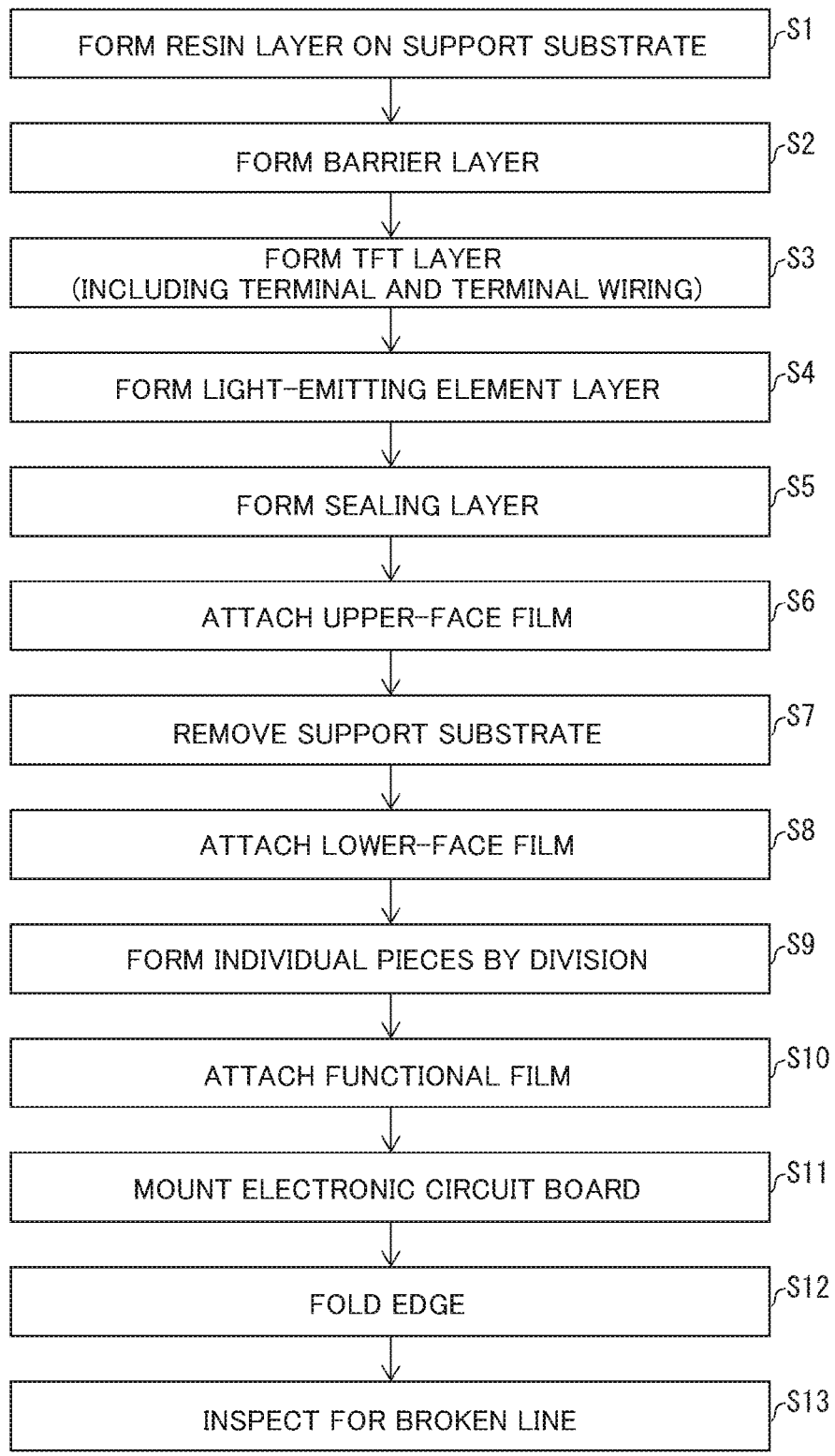
FIG. 1 is a flowchart illustrating a method for producing a display device according to a first embodiment.
Figure 2:
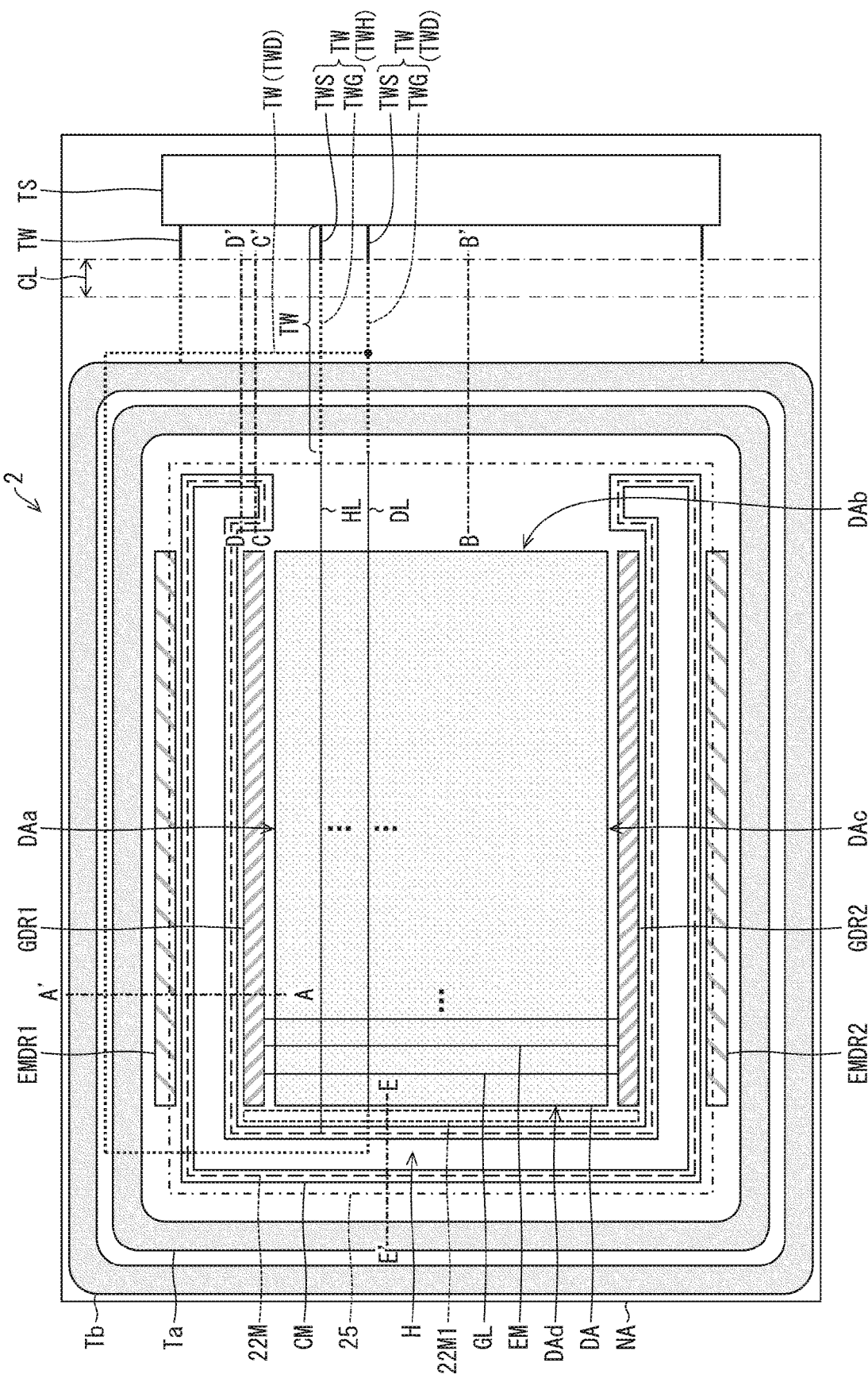
FIG. 2 is a plan view of the display device according to the first embodiment.
Figure 3:
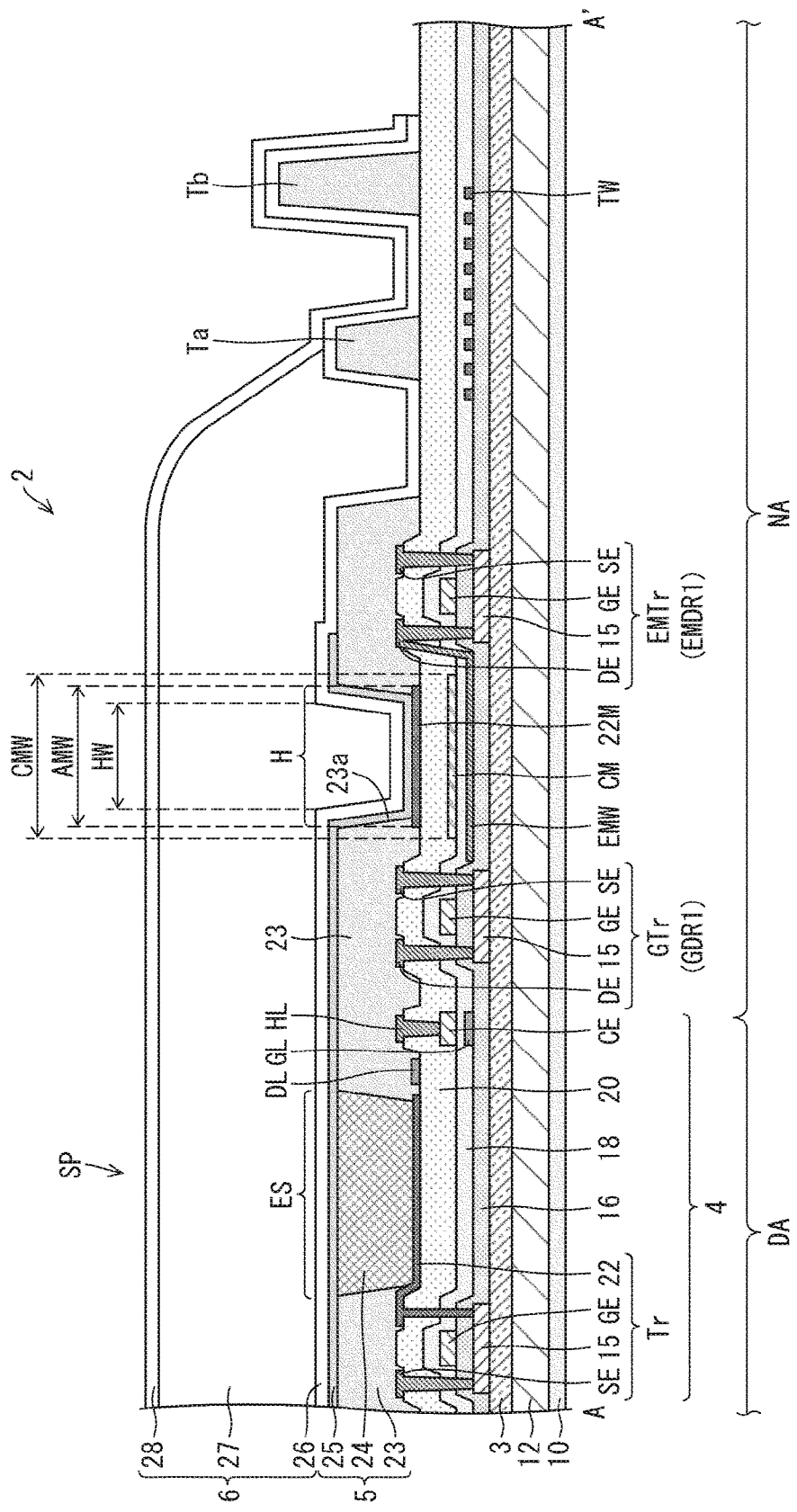
FIG. 3 is a cross-sectional view taken from line A-A' of FIG. 2.
Figure 4:
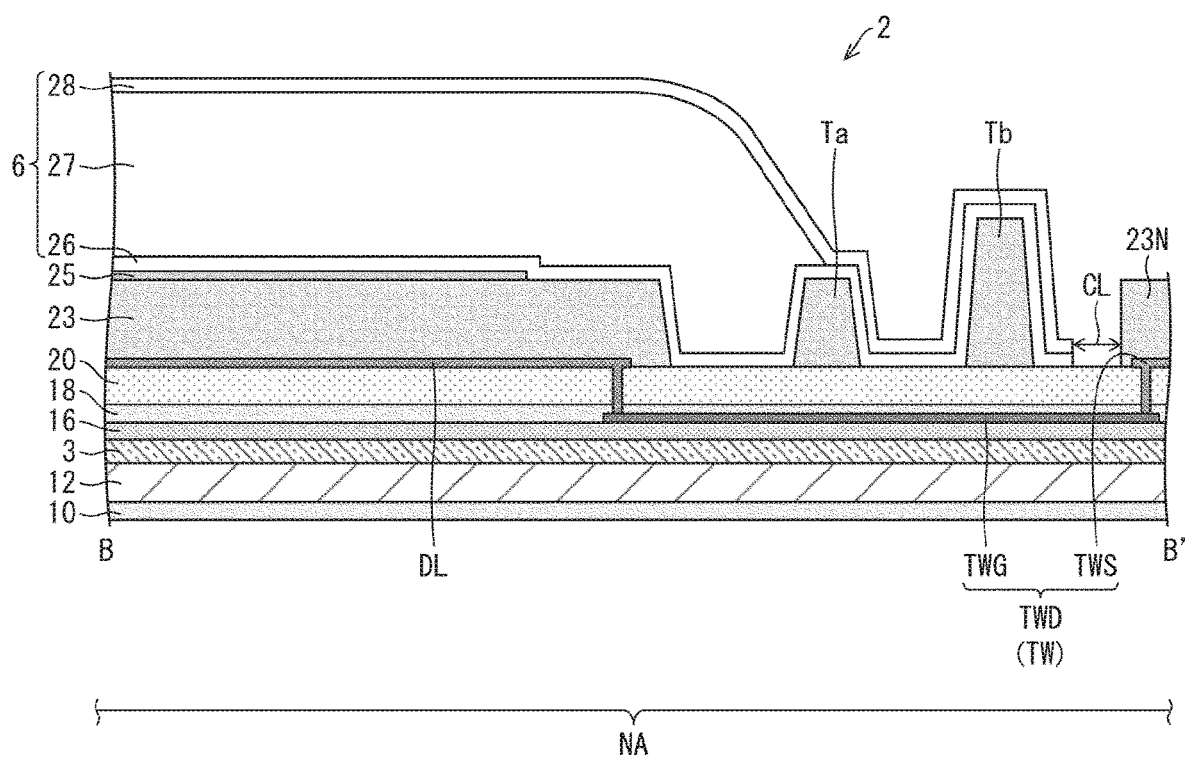
FIG. 4 is a cross-sectional view taken from line B-B' of FIG. 2.
Figure 5:
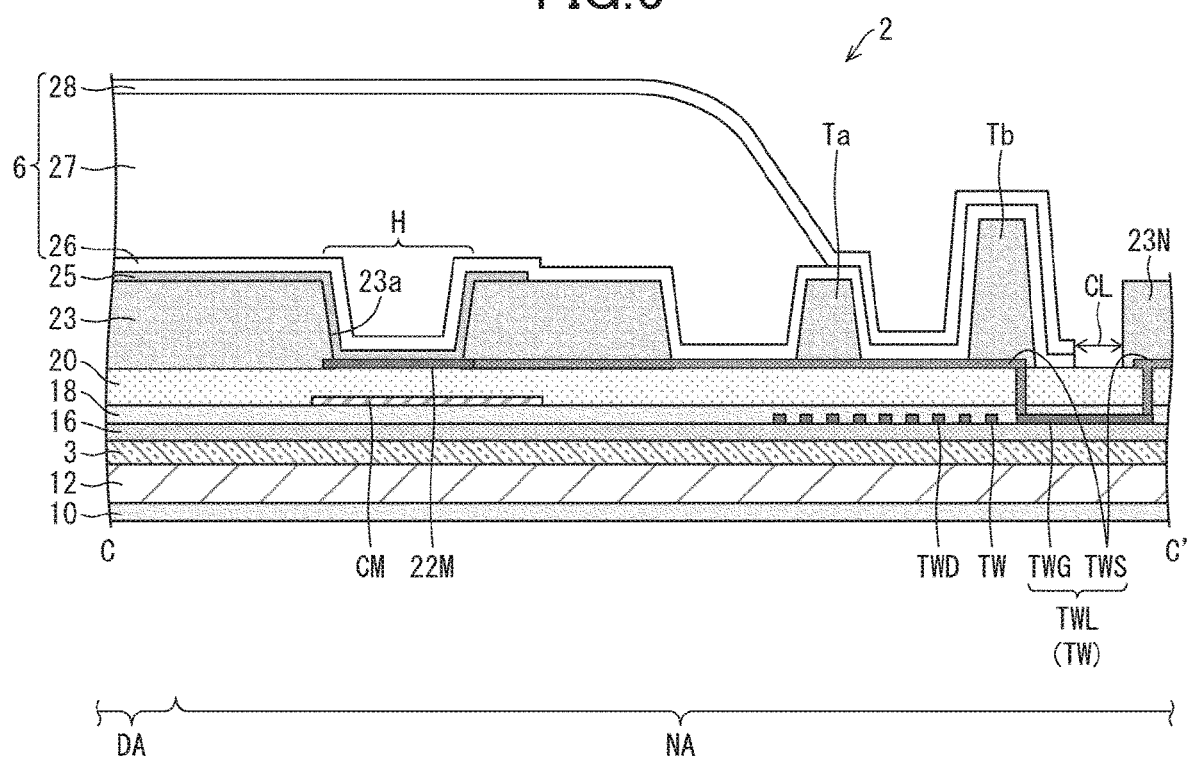
FIG. 5 is a cross-sectional view taken from line C-C' of FIG. 2.
Figure 6:
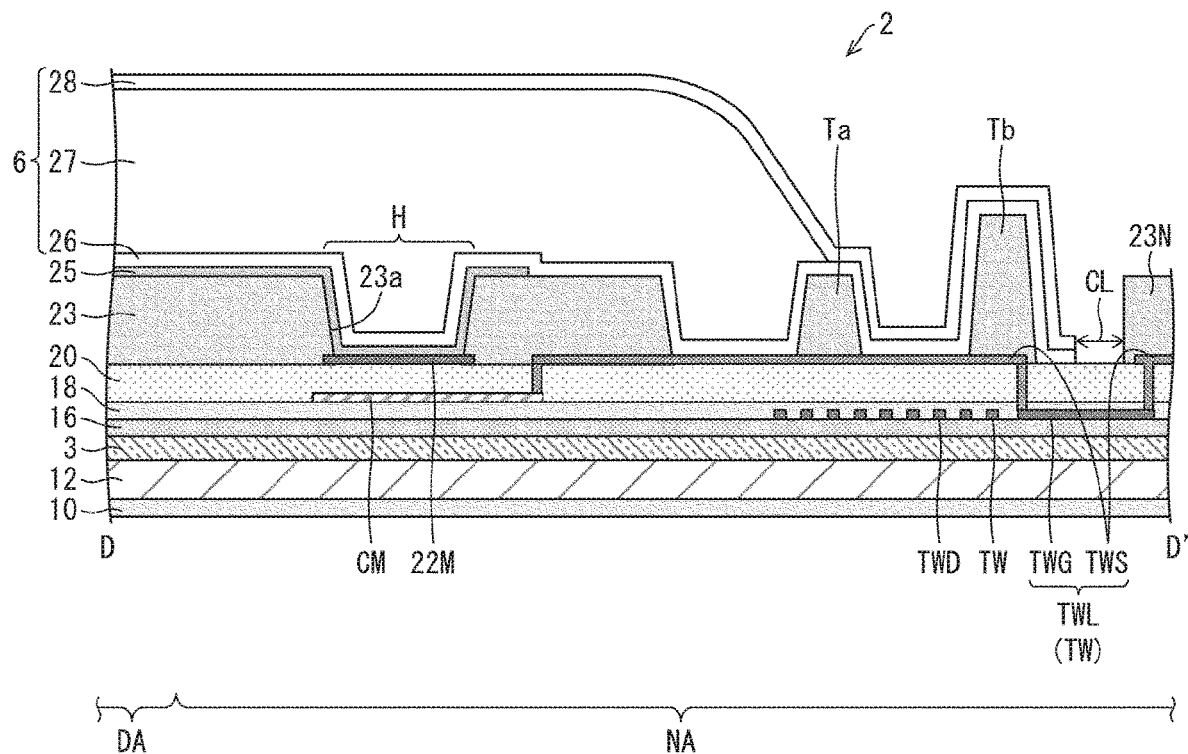
FIG. 6 is a cross-sectional view taken from line D-D' of FIG. 2.

FIG. 1 is a flowchart illustrating a method for producing a display device according to a first embodiment. FIG. 2 is a plan view of the display device according to the first embodiment. FIG. 3 is a cross-sectional view taken from line A-A' of FIG. 2. FIG. 4 is a cross-sectional view taken from line B-B' of FIG. 2. FIG. 5 is a cross-sectional view taken from line C-C' of FIG. 2. FIG. 6 is a cross-sectional view taken from line D-D' of FIG. 2.

In producing a flexible display device, first, as illustrated in FIGS. 1, and 3 to 6, a resin layer 12 is formed on a translucent support substrate (e.g., a mother glass) (Step S1). Next, a barrier layer 3 is formed (Step S2). Next, a thin-film transistor (TFT) layer 4 is formed (Step S3). Next, a light-emitting element layer 5 of a top emission type is formed (Step S4). Next, a sealing layer 6 is formed (Step S5). Next, on the sealing layer 6, an upper-face film is attached (Step S6).

Then, the support substrate is removed from the resin layer 12 with, for example, a laser beam emitted on the support substrate (Step S7). Next, on the lower face of the resin layer 12, a lower-face film 10 is attached (Step S8). Next, a stack including the lower-face film 10, the resin layer 12, the barrier layer 3, the TFT layer 4, the light-emitting element layer 5, and the sealing layer 6 is divided into a plurality of pieces (Step S9). Next, to each of the obtained pieces, a functional film is attached (Step S10). Next, an electronic circuit board (e.g., an IC chip and a flexible printed circuit, or FPC) is mounted on a terminal TS formed at an end of a non-display area NA (a frame area) outside a display area DA in which a plurality of sub-pixels are formed (Step S11). Then, an edge is folded (a folding portion CL in FIG. 2 is folded 180°) so that a display device 2 is formed (Step S12). Next, the display device 2 is inspected for broken line, and if any, the broken line is repaired (Step S13). Note that Steps S1 to S13 are executed by a display device production apparatus (including a deposition apparatus executing each of Steps S1 to S5).

The resin layer 12 is made of, for example, polyimide. The resin layer 12 may be replaced with a double-layer resin film (e.g., a polyimide film), and with an inorganic insulating film sandwiched between the layers of the resin film.

The barrier layer 3 prevents such foreign objects as water and oxygen from reaching the TFT layer 4 and the light-emitting element layer 5. An example of the barrier layer 3 includes a silicon oxide film, a silicon nitride film, or a silicon oxide nitride film formed by the chemical-vapor deposition (CVD), or a multilayer film including those films.

The TFT layer 4 includes: a semiconductor film 15; an inorganic insulating film 16 (a gate insulating film) 16 above the semiconductor film 15; a gate electrode GE, a scanning signal line GL, and a light-emission control line EM above the inorganic insulating film 16; an inorganic insulating film (a first inorganic insulating film) 18 above the gate electrode GE and the scanning signal line GL; a capacitance line CE above the inorganic insulating film 18; an inorganic insulating film (a second inorganic insulating film) 20 above the capacitance line CE; and an anode (a first electrode) 22, a source electrode SE, a data line DL, and a high-level power source line HL above the inorganic insulating film 20.

The semiconductor film 15 is formed of, for example, low-temperature polysilicon (LTPS) or an oxide semiconductor (e.g., an In—Ga—Zn—O-based semiconductor). A thin-film transistor (TFT) Tr is formed to contain the semiconductor film 15, the gate electrode GE, the source electrode SE, and the drain electrode DE. In FIG. 2, the TFT Tr is illustrated as a top-gate TFT. Alternatively, the TFT Tr may be a bottom-gate TFT.

The inorganic insulating films 16 can be, for example, a silicon oxide (SiOx) film, or a silicon nitride (SiNx) film formed by the CVD, or a multilayer film including these films.

The gate electrode (a first metal layer) GE, the scanning signal line GL, the light-emission control line EM, and the capacitance electrode (a second metal layer) CE are each formed of a metal monolayer film or a metal multilayer film including at least one of aluminum, tungsten, molybdenum, tantalum, chromium, titanium, or copper. The gate electrode GE, the scanning signal line GL, and the light-emission control line EM are formed by the same process, of the same material, and in the same layer.

The light-emitting element layer 5 includes: an edge cover (an organic insulating film) 23 having insulation and covering an edge of the anode (the first electrode, namely, a positive electrode) 22; an electro luminescence (EL) layer 24 above the edge cover 23; and a cathode (a second electrode, namely, a negative electrode) 25 above the EL layer 24. The edge cover 23 is formed of, for example, an organic material such as polyimide and acrylic. The organic material is applied and then patterned by photolithography to form the edge cover 23.

For each of the sub-pixels SP, (i) the light-emitting element layer 5 includes the anode 22 and the EL layer 24 each shaped into an island; and a light-emitting element ES (e.g., an organic light-emitting diode (OLED) and a quantum dot light-emitting-diode (QLED)) including the cathode 25, that is, a common layer across the sup-pixels SP, and (ii) the TFT layer 4 includes a sub-pixel circuit (to be described later) controlling the light-emitting element ES.

Figure 7:
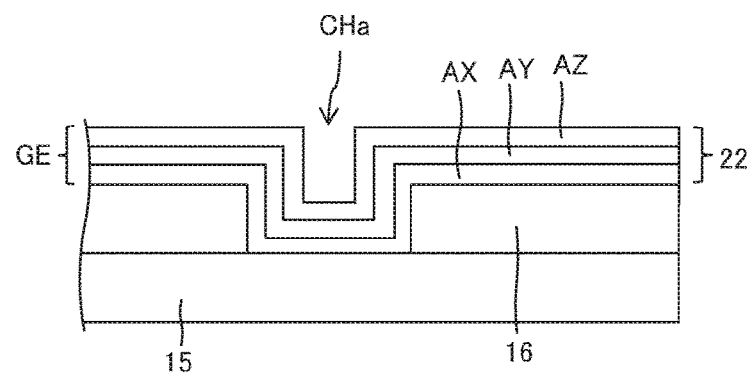
FIG. 7 is an enlarged cross-sectional view illustrating a portion of an anode according to the first embodiment.

FIG. 7 is an enlarged cross-sectional view illustrating a portion of the anode 22 according to the first embodiment. As illustrated in FIG. 7, the anode 22 includes: an indium tin oxide (ITO) film AX (a lower ITO film); an alloy film AY containing Ag; and an ITO film AZ (an upper ITO film) stacked on top of another in the order closer to the lower-face film 10. The anode 22 is reflects light. The alloy film AY is sandwiched between the two ITO films AX and AZ.

The TFT layer 4 in FIGS. 2 to 6 includes a monolayer semiconductor layer and a three-layer metal layer (a metal layer in the same layer as the first metal layer, the second metal layer, and the first electrode).

The gate electrode (the first metal layer) GE is included in a lower layer of the sub-pixel circuit. Among the electrodes included in the sub-pixel circuit, the capacitance electrode (the second metal layer) CE is positioned above the gate electrode GE. The gate electrode GE, the scanning signal line GL, and the light-emission control line EM are formed by the same process (in the same layer, and of the same material).

Among the electrodes included in the sub-pixel circuit, the anode 22 and the source electrode SE are positioned above the capacitance electrode CE. The anode 22, the source electrode SE, the data line DL, and the high-level power source line HL are formed by the same process (in the same layer, and of the same material).

Note that high-level power source lines HL may be provided in the display area DA to intersect each other in a matrix, and connected outside the display area DA through a contact hole provided to the inorganic insulating films 18 and 20. In this case, for example, the high-level power source lines HL extending column-wise (or row-wise) may be formed of the same material and in the same layer as the anode is, and the high-level power source lines HL extending row-wise (or column-wise) may be formed in the second metal layer (the metal layer formed of the same material and in the same layer as the capacitance electrode).

The inorganic insulating films 16, 18, and 20 can be, for example, a silicon oxide (SiOx) film, or a silicon nitride (SiNx) film formed by the CVD, or a multilayer film including these films. The planarization film 21 may be made of an applicable organic material such as polyimide and acrylic.

The cathode 25 can be formed of a translucent conductive material such as an MgAg alloy (an ultra-thin film) and ITO.

The EL layer 24 includes a hole-injection layer, a hole-transport layer, a light-emitting layer, an electron-transport layer, and an electron-injection layer stacked on top of another in the stated order from below. The light-emitting layer is shaped into an island formed in an opening of the edge cover 23 (for each sub pixel SP) by vapor deposition or an ink-jet method. The other layers are shaped into islands or a monolithic form. Moreover, the EL layer 24 may omit one or more of the hole-injection layer, the hole-transport layer, the electron-transport layer, and the electron-injection layer.

In vapor-depositing to form a light-emitting layer of the OLED, a fine metal mask (FMM) is used. The FMM is a sheet (e.g., invar) including many openings. Organic material passing through one opening forms a light-emitting layer (corresponding to one sub-pixel SP) shaped into an island.

A light-emitting layer of the QLED is formed of, for example, a solvent in which quantum dots are dispersed. The solvent is applied by an ink-jet method to form the light-emitting layer (corresponding to one sub-pixel SP) shaped into an island.

If the light-emitting element ES is the OLED, holes and electrons recombine together in the light-emitting layer by a drive current between the anode 22 and the cathode 25, which forms an exciton. While the exciton transforms to the ground state, light is released. Since the cathode 25 is translucent and the anode 22 is light-reflective, the light emitted from the EL layer 24 travels upward. This is how the light-emitting element layer 5 is of a top emission type.

If the light-emitting element ES is the QLED, holes and electrons recombine together in the light-emitting layer by a drive current between the anode 22 and the cathode 25, which forms an exciton. While the exciton transforms from the conduction band level to the valence band level, light (fluorescence) is released.

In the light-emitting element layer 5, a light-emitting element (an inorganic light-emitting diode) other than the OLED and the QLED may be formed.

Of the four sides of the display area DA, sides in parallel with the direction in which scanning signal lines GL are arranged (that is, the sides in parallel with the direction in which data lines DL extend) are referred to as a first side DAa and a third side DAc. In FIG. 3, the first side DAa and the third side DAc are respectively on the upper side and the lower side of the drawing. Of the four sides of the display area DA, the other sides in parallel with the direction in which data lines DL are arranged (that is, the sides in parallel with a direction in which the scanning signal lines GL extend) are referred to as a second side DAb and a fourth side DAd. In FIG. 3, the second side DAb and the fourth side DAd are respectively on the right side and the left side of the drawing. The second side DAb is one of the pair of sides facing each other on the display area DA, and positioned closer to the terminal TS on which the electronic circuit board is mounted. The fourth side DAd is the other one of the pair of sides facing each other on the display area DA, and positioned away from the terminal TS.

In the non-display area NA, a first frame bank Ta and a second frame bank Tb are formed to define edges of an organic buffer film 27. The first frame bank Ta and the second frame bank Tb each surround the display area DA. The first frame bank Ta acts as a liquid barrier in forming the organic buffer film 27 by an ink-jet method. The second frame bank T surrounds the circumference of the first frame bank Ta, and acts as a backup liquid barrier. The first frame bank Ta and the second frame bank Tb are provided in the same layer as the edge cover 23, and can be formed by the same process and of the same material as the edge cover 23. The first frame bank Ta may be formed thicker than the second frame bank Tb.

The sealing layer 6 is translucent, and includes: an inorganic sealing film 26 covering the cathode 25; an organic buffer film 27 above the inorganic sealing film 26; and an inorganic sealing film 28 above the organic buffer film 27. The sealing layer 6 covering the light-emitting element layer 5 prevents such foreign objects as water and oxygen from penetrating into the light-emitting element layer 5.

The inorganic sealing films 26 and 28 are both inorganic insulating films. An example of the inorganic sealing films 26 and 28 includes a silicon oxide film, a silicon nitride film, or a silicon oxide nitride film formed by the CVD, or a multilayer film including those films. The organic buffer film 27 is a translucent organic film providing a planarized face. The organic buffer film 27 may be made of an applicable organic material such as acrylic. The organic buffer film 27 can be formed by, for example, inkjet application. The non-display area NA may be provided with a bank to block droplets.

The lower-face film 10 is attached to the lower face of the resin layer 12 after the support substrate is removed, so that the display device excels in flexibility. The lower-face film 10 is made of, for example, polyethylene terephthalate (PET). The functional film 39 has at least one of such functions as optical compensation, touch sensing, and protection.

The electronic circuit board mounted on the TS extends along a side of the display device 2. The electronic circuit board includes, for example: a high-level power source generating a high-level power source voltage (ELVDD); a low-level power source generating a low-level power source voltage (ELVSS), and a data driver controlling to drive the data lines DL. The electronic circuit board is provided to the terminal TS extending along a side of an outline, of the display device 2, in the non-display area NA. The terminal TS receives various signals from various circuits of the electronic circuit board, and transmits the signals to a routed wire TW connected to the terminal TS. Hence, the routed wire TW connected to the terminal TS transmits various signals to the display area DA.

Described above is a flexible display device. In the case where an inflexible display device is produced, steps such as forming a resin layer and replacing a base material are usually unnecessary. Hence, for example, the glass substrate undergoes stacking steps such as Steps S2 to S5, and then proceeds to Step S9.

Method for Forming TFT Layer and Light-Emitting Element Layer

Figure 8:
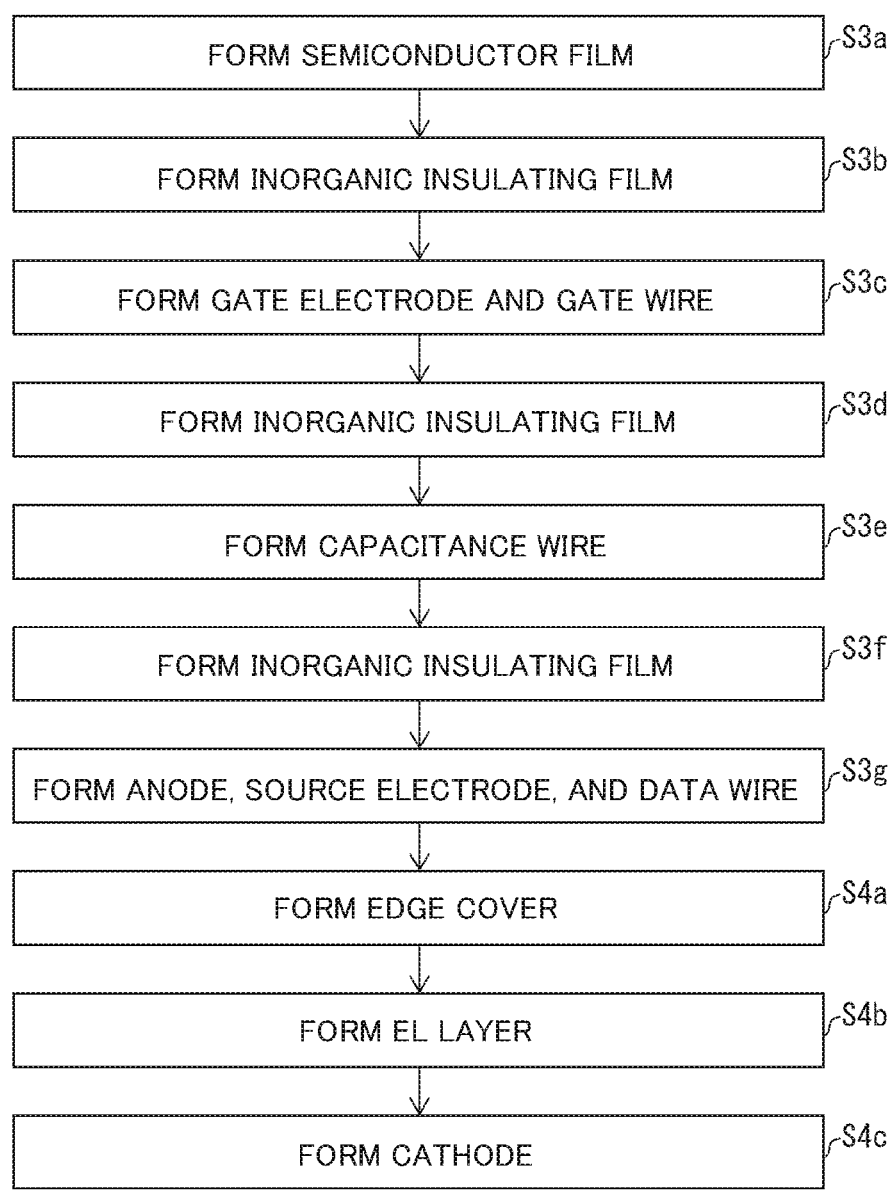
FIG. 8 is a flowchart illustrating a method for forming a TFT layer and a light-emitting element layer according to the first embodiment.

FIG. 8 is a flowchart illustrating a method for forming a TFT layer and a light-emitting element layer according to the first embodiment. As illustrated in FIGS. 3 to 8, the semiconductor film 15 is formed, followed by Step S2 in FIG. 1(Step S3a). If, in this Step S3a, the semiconductor film 15 is an oxide semiconductor film, a predetermined area of the patterned oxide semiconductor is reduced to form capacitance wiring that is a conductor.

Next, the inorganic insulating film 16, namely a gate insulating film, is formed (Step S3b).

Then, the gate electrode GE and the scanning signal line GL are formed in a single step (Step S3c). Hence, the first metal layer is formed.

Then, the inorganic insulating film 18 is formed to cover the gate electrode GE and the scanning signal line GL (Step S3d).

Next, the capacitance electrode CE is formed on the inorganic insulating film 18 (Step S3e). Hence, the second metal layer is formed.

Then, the inorganic insulating film 20 is formed to cover the capacitance electrode CE (Step SM).

Next, on the inorganic insulating film 20, the anode 22, the source electrode SE, the data line DL, and the high-level power source line HL are formed in a single step (Step S3g). Hence, a metal layer is formed in the same layer as the anode 22. This is how the TFT layer is formed.

The data line DL is a data signal line to supply a data signal voltage (a voltage to indicate a grayscale level). The anode 22 is connected to the semiconductor film 15 through a contact hole formed in the inorganic insulating film 20. Hence, the anode 22 also functions as a drain electrode of the TFT Tr. The high-level power source line HL is connected to the capacitance electrode CE through a contact hole formed in the inorganic insulating film 20.

Next, the edge cover 23 is formed to cover an edge of the anode 22 (Step S4a). Here, an applied organic insulating film is patterned by photolithography to form the edge cover 23. Note that the opening of the edge cover 23 defines an area in which the sub-pixel SP emits light.

Next, the EL layer 24 is formed in the opening of the edge cover 23 by a vapor deposition using an FMM (Step S4b). Next, the cathode 25 is formed into a monolithic form (Step S4c).

The edge cover 23 partially covers the source electrode SE and the anode 22. As illustrated in FIGS. 3 to 6, for example, the capacitance required for the sub-pixel circuit is formed in an overlap between the capacitance CE connected to the high-level power source HL through the contact hole and the scanning signal line GL. Note that the capacitance may be formed in an overlap between the capacitance electrode CE connected to the data line DL and the scanning signal line GL.

Figure 9:
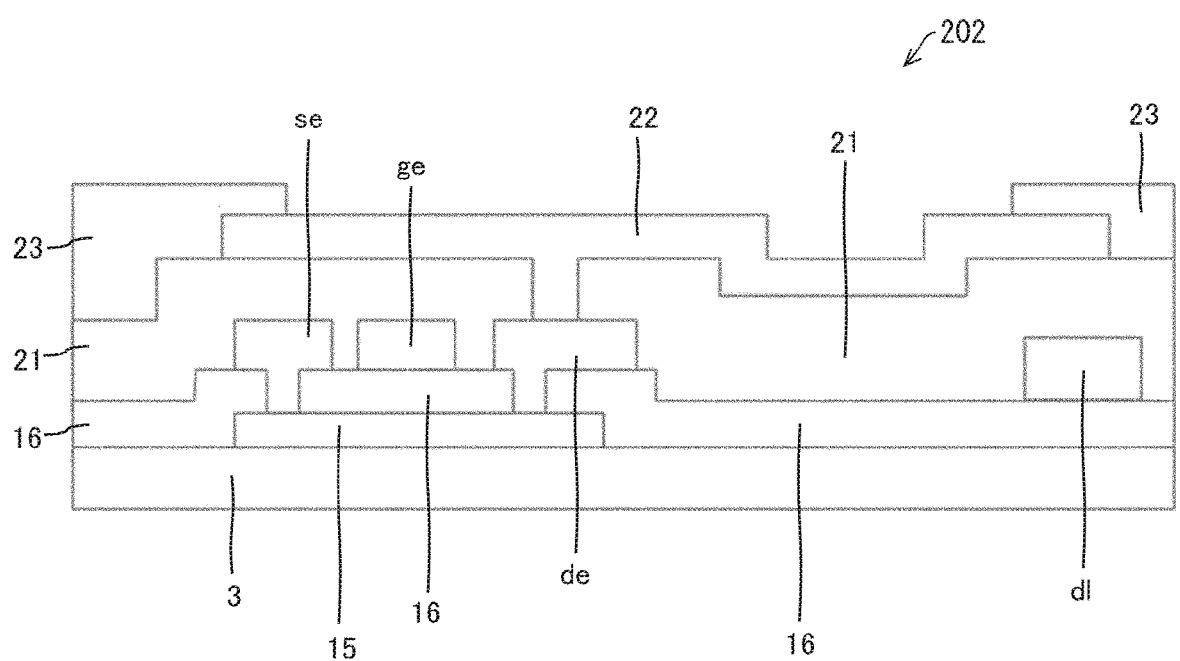
FIG. 9 is an enlarged cross-sectional view illustrating a portion of a display device according to a comparative example of the first embodiment.

FIG. 9 is an enlarged cross-sectional view illustrating a portion of a display device 202 according to a comparative example of the first embodiment.

Compared with the display device 202 according to the comparative example illustrated in FIG. 9, the configuration of the display device 2 according to the first embodiment eliminates the need of a source electrode se, a drain electrode de, and a data line d1 provided below the anode 22. Such a feature makes it possible to keep the light-emitting element layer from adverse effects of bumps formed by the source electrode se, the drain electrode de, and the data line d1, which are usually thick. Furthermore, the feature eliminates the need of the planarization film 21 formed of a usually expensive material, contributing to significant cut in costs together with reduction in production steps.

Moreover, the planarization film 21 provided in the display area is resin. In downstream processes after the planarization film 21 is provided, the planarization film 21 undergoes multiple photolithography and etching processes, such that water accumulates inside the resin during the processes. The accumulated water poses a problem of deteriorating a light-emitting element over a long period of time. Meanwhile, the display device 2 eliminates the need of the planarization film 21, also making it possible to prevent deterioration of a light-emitting element.

Moreover, as illustrated in FIG. 7, the ITO film AX included in the anode 22 is in contact with the semiconductor film 15 including an oxide semiconductor (e.g., an In—Ga—Zn—O-based semiconductor). Such a feature reduces contact resistance, contributing to providing a transistor which excels in switching characteristics.

Configuration of Sub-Pixel Circuit

Figure 10:
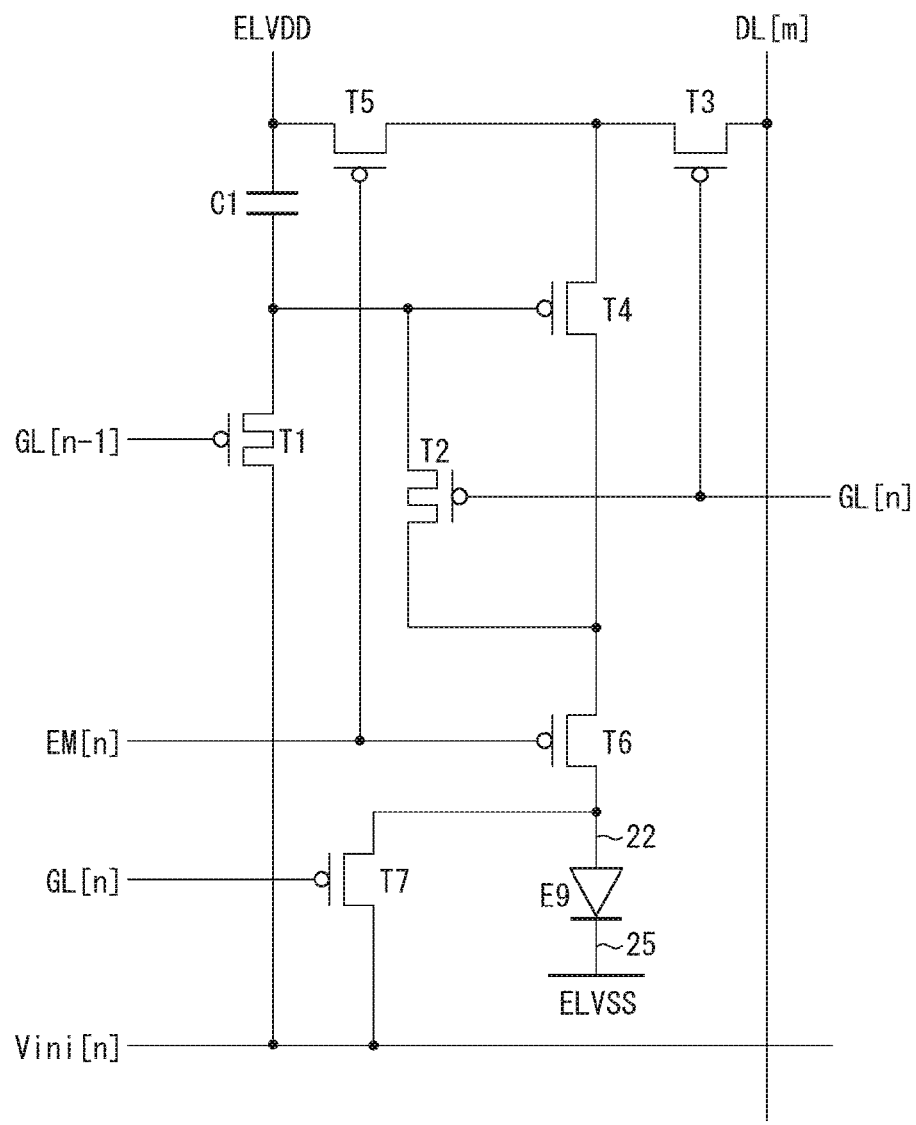
FIG. 10 is a diagram illustrating a configuration of a sub-pixel circuit disposed in a display area of the display device according to the first embodiment.

FIG. 10 is a diagram illustrating a configuration of a sub-pixel circuit disposed in the display area DA. FIG. 10 illustrates a configuration of the sub-pixel circuit in an m×n matrix. Note that the configuration of the sub-pixel circuit described here is an example, and another configuration can be adopted.

As illustrated in FIGS. 2 and 10, the display area DA includes a plurality of data lines DL[m] and a plurality of high-level power source lines ELVDD extending in a column direction, and a plurality of scanning signal lines GL[n−1], GL[n] and a plurality of light-emission control lines EM[n] extending in a row direction intersecting with the column direction. Moreover, the display area DA is provided with an initialization power source line Vini[n].

Each of the light-emission control lines EM[n] is provided for a corresponding one of the scanning signal lines GL[n]. Each of the high-level power source lines ELVDD may be provided for a corresponding one of the data lines DL[m], or may be provided for two or more of the data lines DL[m]. The high-level power source line ELVDD supplies a high-level power source voltage (ELVDD) which is a common constant voltage among the sub-pixel circuits in the display area DA.

A capacitor C1 includes the capacitance electrode CE and the scanning signal line GL (FIG. 3). The capacitance electrode CE and the scanning signal line GL has an overlap accumulating capacitance required for operation of the sub-pixel circuit. The capacitance electrode CE is connected to the high-level power source line ELVDD to supply the high-level power source voltage (ELVDD).

The cathode 25 of the light-emitting element ES is supplied with the low-level power source voltage (ELVSS) which is a common constant voltage among the sub-pixel circuits.

As an example, the low-level power source voltage (ELVSS), namely a constant voltage, is approximately −4 V, the high-level power source voltage (ELVDD), namely a constant voltage, is approximately 5 V, the initialization power source voltage (Vini), namely a constant voltage, is approximately −5 V, a light-emission control voltage (EM) is approximately −8 V when active (ON) and approximately 7 V when inactive (OFF), a scanning signal voltage (scan) is approximately −8 V when active (ON) and approximately 7 V when inactive (OFF), and a data signal voltage (date) is approximately 6 V when active (presenting black) and approximately 3 V when inactive (presenting white).

Moreover, in an example illustrated in FIG. 10, the sub-pixel circuit includes such transistors formed in the TFT layer 4 as: an initialization transistor T1; a threshold voltage compensation transistor T2; a write-control transistor T3; a drive transistor T4; a power source supply control transistor T5; a light-emission control transistor T6; and an anode-charge discharging transistor T7. The write-control transistor T3 is connected to the scanning signal line GL[n] and the data line DL[m].

Then, while the scanning signal line GL[n] is active, the data line DL[m] supplies the sub pixel SP with a potential signal based on a grayscale level to be presented. While the light-emission control line EM[n] is active, the light-emitting element ES emits light with the brightness based on data of a grayscale level to be presented.

Specific Configuration of Non-Display Area NA

As illustrated in FIGS. 2 to 6, the non-display area NA is provided with a plurality of routed wires TW for supplying various voltages from the electronic circuit board through the terminal TS to the display area DA.

The routed wires TW include a wire TWG, of the first metal layer, formed in the first metal layer.

The routed wires TW are connected at one end to the terminal TS, so as to be connected to the circuits of the electronic circuit board through the terminal TS. The routed wires TW extend at another end toward the display area DA, and are connected to, for example, various wires.

For example, the routed wires TW include wires TWS and TWG of the first metal layer. The first wire TWS is formed in the same layer as the data line DL and the anode 22, and on the inorganic insulating film 20. The first wire TWS extends from the terminal TS until immediately before the folding portion CL. Furthermore, the first wire TWS may be provided on the inorganic insulating film 20 closer to the display area DA than to the folding portion CL.

The wire TWG of the first metal layer is formed in the same layer as the gate electrode GE, and on the inorganic insulating film insulating film 16. The wire TWG has one end connected to the first wire TWS through a contact hole formed in the inorganic insulating films 18 and 20, and runs below, to intersect with, the folding portion CL. The wire TWG has another end connected to various wires through a contact hole. Moreover, the TWG of the first metal layer may be provided on the inorganic insulating film 16 closer to the display area DA than to the folding portion CL.

Of the routed wires TW, the example in FIG. 4 illustrates a routed wire TWD having one end connected to a data driver through the terminal TS, and another end connected to the data line DL. The routed wire TWD supplies the data line DL with a data signal voltage to be supplied from the data driver.

Of the routed wires TW, the example in FIG. 5 illustrates a routed wire TWL having one end connected to the low-level power supply through the terminal TS, and another end connected to a first conductive layer 22M. The routed wire TWL supplies the cathode 25 through the first conductive layer 22M with the low-level power supply voltage (ELVSS) to be supplied from the low-level power supply. The details thereof will be described later.

Of the routed wires TW, the example in FIG. 6 illustrates the routed wire TWL having one end connected to the low-level power supply through the terminal TS, and another end connected to a second conductive layer CM. The routed wire TWL supplies the second conductive layer CM with the low-level power supply voltage (ELVSS) to be supplied from the low-level power supply. The details thereof will be described later. Hence, the second conductive layer CM is supplied with the low-level power supply voltage (ELVSS), making it possible to keep noise other than the low-level power supply voltage (ELVSS) from entering the cathode 25 overlapping the second conductive layer CM. When the second conductive layer CM is supplied with the low-level power source voltage (ELVSS), the second conductive layer CM is preferably connected to the routed wire TWL out of the edge of the cathode 25. Such a feature makes it possible to more reliably keep noise other than the low-level power supply voltage (ELVSS) from entering the cathode 25 overlapping the second conductive layer CM.

Furthermore, alternatively, the routed wires TW may include routed wires, for example, connected at one end through the terminal TS to the high-level power supply of the electronic circuit board, and connected at another end to the high-level power supply lines HL, so as to supply the high-level power supply voltage (ELVDD) to the high-level power supply lines HL.

As illustrated in FIGS. 2 to 6, the edge cover 23 includes a slit H formed in the non-display area NA to surround at least a portion of an outer periphery of the display area DA.

The slit H is a groove formed in the edge cover 23. For example, the slit H surrounds three sides (e.g., the first side DAa, the third side DAc, and the fourth side DAd) in the outer periphery of the display area DA, with opposing ends spaced apart from each other. The opposing ends of the slit H are spaced apart from each other in an area, of the display area DA, between the second side DAb and the terminal TS. That is, the slit H is interrupted in the area, of the display area DA, between the second side DAb and the terminal TS.

Moreover, the cathode 25 covering the display area DA reaches the non-display area NA. Hence, the cathode 25 is also formed in the slit H. Note that the cathode 25 is formed in the non-display area NA, unless the edge of the cathode 25 overlaps the first frame bank Ta.

In the non-display area NA, the first conductive layer 22M is formed in the same layer as, and separated from, the anode 22. The first conductive layer 22M is provided on a bottom face and a side face inside the slit H.

For example, the first conductive layer 22M surrounds three sides (e.g., the first side DAa, the third side DAc, and the fourth side DAd) in the outer periphery of the display area DA, with opposing ends spaced apart from each other. The opposing ends of the first conductive layer 22M are spaced apart from each other in an area, of the display area DA, between the second side DAb and the terminal TS. That is, the first conductive layer 22M is interrupted in the region, of the display area DA, between the second side DAb and the terminal TS.

The first conductive layer 22M overlaps the above cathode 25 in the slit H, to be electrically connected to the cathode 25. Moreover, the first conductive layer 22M is connected to the routed wire TWL, of the routed wires TW, having one end connected to the low-level power supply provided to the electronic circuit board through the terminal TS (FIG. 5).

Hence, the low-level power supply voltage (ELVSS) supplied from the low-level power supply is supplied through the routed wire TWL to the first conductive layer 22M inside the slit H. Then, the low-level power supply voltage (ELVSS) is supplied from the first conductive layer 22M to the cathode 25. Such a feature makes it possible to supply the low-level power supply voltage (ELVSS), required for the light-emitting element ES to emit light, to each of the sub-pixel circuits in the display area DA.

The first conductive layer 22M is in contact with the cathode 25 inside the slit H, so as to surround three sides (e.g., the first side DAa, the third side DAc, and the fourth side DAd) in the outer periphery of the display area DA. Such a feature makes it possible to uniformly supply a face of the display area DA with the low-level power supply voltage (ELVSS), namely, a constant voltage.

In the example illustrated in FIG. 3, when a length in a direction away from the display area DA is determined as "width", a width AMW of the first conductive layer 22M is greater than a width HW of the slit H, and is smaller than a width CMW of the second conductive layer CM.

Moreover, in the display device 2, the non-display area NA includes, in areas next to the display area DA, scanning signal control drivers GDR1 and GDR2 and light-emitting signal control circuits EMDR1 and EMDR2. The scanning signal control driver GDR1 and the light-emitting signal control circuit EMDR1 are provided to extend along the first side DAa of the display area DA. The scanning signal control driver GDR2 and the light-emitting signal control circuit EMDR2 are provided to extend along the third side DAc of the display area DA.

To each of the scanning signal control drivers GDR1 and GDR2, the scanning signal lines GL are connected. In the display device 2, scanning drivers SDR1 and SDR2 control to drive, from opposing sides (the first side DAa and the third side DAc) of the display area DA, the scanning signal lines GL provided in the display area DA.

To each of the light-emitting signal control circuits EMDR1 and EMDR2, the light-emission control lines EM are connected. In the display device 2, the light-emitting signal control circuits EMDR1 and EMDR2 control to drive, from opposing sides (the first side DAa and the third side DAc) of the display area DA, the light-emission control lines EM provided in the display area DA.

The scanning signal control driver GDR1 and the light-emitting signal control circuit EMDR1 are provided to face each other across the slit H. The scanning signal control driver GDR2 and the light-emitting signal control circuit EMDR2 are provided to face each other across the slit H.

As illustrated in FIG. 3, the scanning signal control drivers GDR1 and GDR2 include a plurality of scanning driver transistors GTr produced by the same production process as the TFT Tr included in the TFT layer 4. The light-emitting signal control circuits EMDR1 and EMDR2 include a plurality of light-emitting driver transistors EMTr produced by the same production process as the TFT Tr included in the TFT layer 4. Each of the scanning driver transistors GTr and each of the light-emitting driver transistors EMTr include the semiconductor film 15, the gate electrode GE, the source electrode SE, and the drain electrode DE. Note that the source electrode SE and the drain electrode DE are formed by the same process as the anode 22.

For example, the light-emitting driver transistors EMTr are positioned outside the slit H, that is, away from the display area DA, and provided along a direction in which the slit H extends. The scanning driver transistors GTr are positioned inside the slit H, that is, close to the display area DA, and provided along the direction in which the slit H extends. This is because, a signal traveling through each of the scanning signal lines GL is shorter in active (ON) time period than a signal traveling through the light-emission control line EM, and an effect affected by coupling to the second conductive layer CM is greater than that of the signal traveling through the light-emission control line EM. Such a feature makes it possible to reduce effects, caused by the coupling to the second conductive layer CM, on the signal traveling through the scanning signal lines GL.

Then, a routed wire TWDR is provided in the same layer as, and separated from, the gate electrode GE. For example, of the routed wires TW, the routed wire TWDR is connected either to the light-emitting driver transistor EMTr to send the light-emitting driver transistor EMTr the control voltage of the light-emission control line EM, or to the scanning driver transistor GTr to send the scanning driver transistor GTr the control voltage of the scanning signal line GL.

The routed wire TWDR is provided below the slit H, and extends to intersect with the slit H and the first conductive layer 22M.

As can be seen, the display device 2 is provided with various kinds of the routed wires TW routed, using the metal layer included in the same layer as the gate GE. These routed wires TW receives various kinds of voltages (e.g., the high-level power supply voltage, and the data signal voltage) other than the low-level power supply voltage (ELVSS).

Here, the display device 2 is not provided with the planarization film 21 that is provided below the anode 22 in the display device 202 (FIG. 9). Hence, the display device 2 includes, in close proximity to each other, the first conductive layer 22M provided in the same layer as the anode 22 and supplied with the low-level power supply voltage, and the routed wire TWDR routed in the metal layer in the same layer as the gate GE.

In particular, in the slit H, the first conductive layer 22M is provided on the bottom face of the slit H. Hence, in the slit H, the first conductive layer 22M and the routed wire TWDR are positioned in close proximity to each other.

Hence, it is not conventionally preferable to provide a routed wire to intersect with the slit, such that the routed wire has to be routed not to intersect with the slit as much as possible.

Hence, in the display device 2 illustrated in FIGS. 2 to 6, the second conductive layer CM, which is formed in the same layer as the capacitance electrode CE, is provided to overlap the slit across from the inorganic insulating film 20.

That is, the second conductive layer CM is provided between the first conductive layer 22M in the slit H and the routed wire TWDR provided below the slit H.

Hence, even if the routed wire TWDR is provided to at least partially overlap with the slit H, the second conductive layer CM can block an effect of a capacitance load on each of the voltage (e.g., the low-level power supply voltage (ELVSS)) of the first conductive layer 22M in the slit H and the voltage (e.g., the control voltage of the light-emission control line EM, or the control voltage of the scanning signal line GL) of the routed wire TWDR in the slit H, the effect being caused by the difference between the voltages. Such a feature makes it possible in the display device 2 to provide the routed wire TWDR to intersect with the slit H. Accordingly, the display device 2 increases in flexibility of designing the routed wires TW, making it possible to present noise-free high-quality images.

Figure 15:
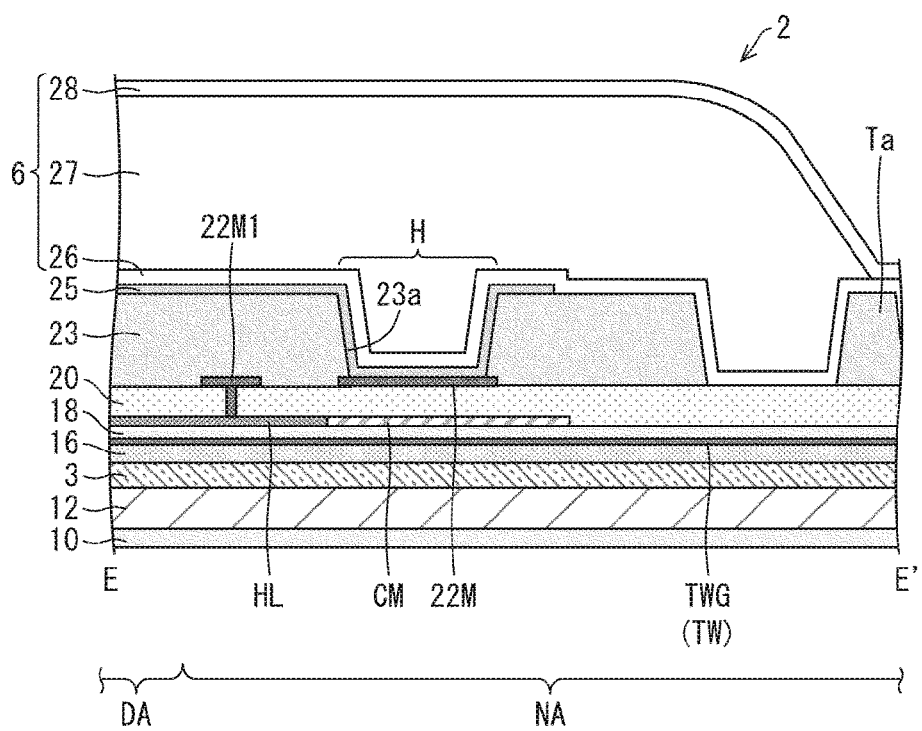
FIG. 15 is a cross-sectional view taken from line E-E' of FIG. 2.

The routed wire TW illustrated in FIG. 15 has one end connected to the terminal TS, and includes the wire TWG of the first metal layer. The routed wire TW extends from the non-display area NA to the display area DA to intersect with a first conductive layer 22M and the second conductive layer CM at the slit H, and electrically connects to the wiring of the display area DA. Then, at the slit H, the routed wire TW illustrated in FIG. 15 overlaps the first conductive layer 22M across from the inorganic insulating film 18, the second conductive layer CM, and the inorganic insulating film 20. As can be seen, the routed wire TW includes the wire TWG of the first metal layer, making it possible to run below the second conductive layer CM and intersect with the slit H. Such a feature increases flexibility in designing wiring.

Furthermore, the description above shows an example in which the routed wire TWDR overlaps the first conductive layer 22M supplied with the low-level power supply voltage (ELVSS). Alternatively, for example, the routed wire TWDR may also overlap a member to be supplied with another constant voltage (e.g., the high-level power supply voltage (ELVDD), or the initialization power source voltage (Vini)).

Moreover, the second conductive layer CM may be supplied with the high-level power supply voltage (ELVDD). In this case, the second conductive layer CM is electrically connected to a routed wire TWH, of the routed wires TW, through a contact hole provided in the inorganic insulating film 20. The routed wire TWH has one end connected through the terminal TS to the high-level power supply provided to the electronic circuit board.

Alternatively, the high-level power supply line HL in the display area DA extends from the display area DA, across the fourth side DAd of the display area DA, and into the non-display area NA, to overlap the second conductive layer CM. Hence, the second conductive layer CM and the high-level power supply line HL extended into the non-display area NA are connected together through a contact hole provided in the inorganic insulating film 20, so that the second conductive layer CM may be supplied with the high-level power supply voltage (ELVDD).

In the example illustrated in FIG. 15, the high-level power supply line HL extends from the display area DA, and across the fourth side DAd of the display area DA away from the terminal TS, so as to overlap, and connect to, the second conductive layer CM. Then, as illustrated in FIG. 15, the high-level power source line HL is connected to a third conductive layer 22M1 through a contact hole provided in the inorganic insulating film 20. The third conductive layer 22M1 is formed (i) between the fourth side DAd of the display area DA and the second conductive layer CM, and (ii) of the same material as, and in the same layer as, the anode 22. This third conductive layer 22M1 makes it possible to reduce resistance of the high-level power supply line HL. The third conductive layer 22M1 is not electrically connected to the first conductive layer 22M.

Then, for example, the routed wire TW (i.e., the routed wire TW connected to the data driver), to which the data signal voltage is applied, runs to intersect with the second conductive layer CM supplied with this high-level power supply voltage (ELVDD).

The data signal voltage ranges, for example, approximately from 3 V (e.g., when the light-emitting element emits white light) to 6 V (e.g., when the light-emitting element emits black light). The high-level power supply voltage is, for example, approximately 5 V. Hence, the data signal voltage and the high-level power supply voltage are relatively close to each other. Such a feature makes it possible to more reliably reduce an effect of noise between the second conductive layer CM and the routed wire TW intersecting with the second conductive layer CM.

Note that the second conductive layer CM may be provided with another constant voltage (e.g., the high-level power supply voltage (ELVDD), or the initialization power source voltage (Vini)). Moreover, the second conductive layer CM may be electrically ungrounded with no voltage supplied thereto.

Furthermore, the second conductive layer CM surrounds three of the sides of the display area DA. Hence, when the second conductive layer CM is supplied with the high-level power supply voltage, the high-level power supply line ELVDD, provided to the display area DA, may have an end, close to the fourth side DAd (an end away from the terminal TS), extending from the display area DA to the non-display area NA, and connected to the second conductive layer CM. Such a feature makes it possible to make the high-level power supply line ELVDD in the display area DA uniform to be a constant voltage. As a result, the display device 2 can display higher-quality images.

Furthermore, the data lines DL provided in the display area DA may include: a data line DL having one of opposing ends, which is close to the terminal TS, connected to a routed wire TWD included in the routed wires TW and connected to the data driver; and a data line DL having one of opposing ends, which is away from the terminal TS, connected to the routed wire TWD included in the routed wires TW and connected to the data driver. Such a feature makes it possible to supply the data lines DL, provided in the display area DA, with the data signal voltage from both ends.

Note that the routed wire TWD, which is connected to one of the opposing ends of the data line DL away from the terminal TS, may branch off from the routed wire TWD, which is connected to another one of the opposing ends of the data line DL close to the terminal TS, or may be connected to the data driver.

As can be seen, the display device 2 is provided with the second conductive layer CM, allowing flexibility of designing the routed wires TW, and making it possible to route wires from the data driver to the ends of the data signal lines DL positioned in an area away from the data driver.

Note that, of the opposing ends of the data line DL, the end close to the terminal TS alone may be connected to the routed wire TWD, so that the data signal voltage may be input to one end alone.

Second Embodiment

Figure 11:
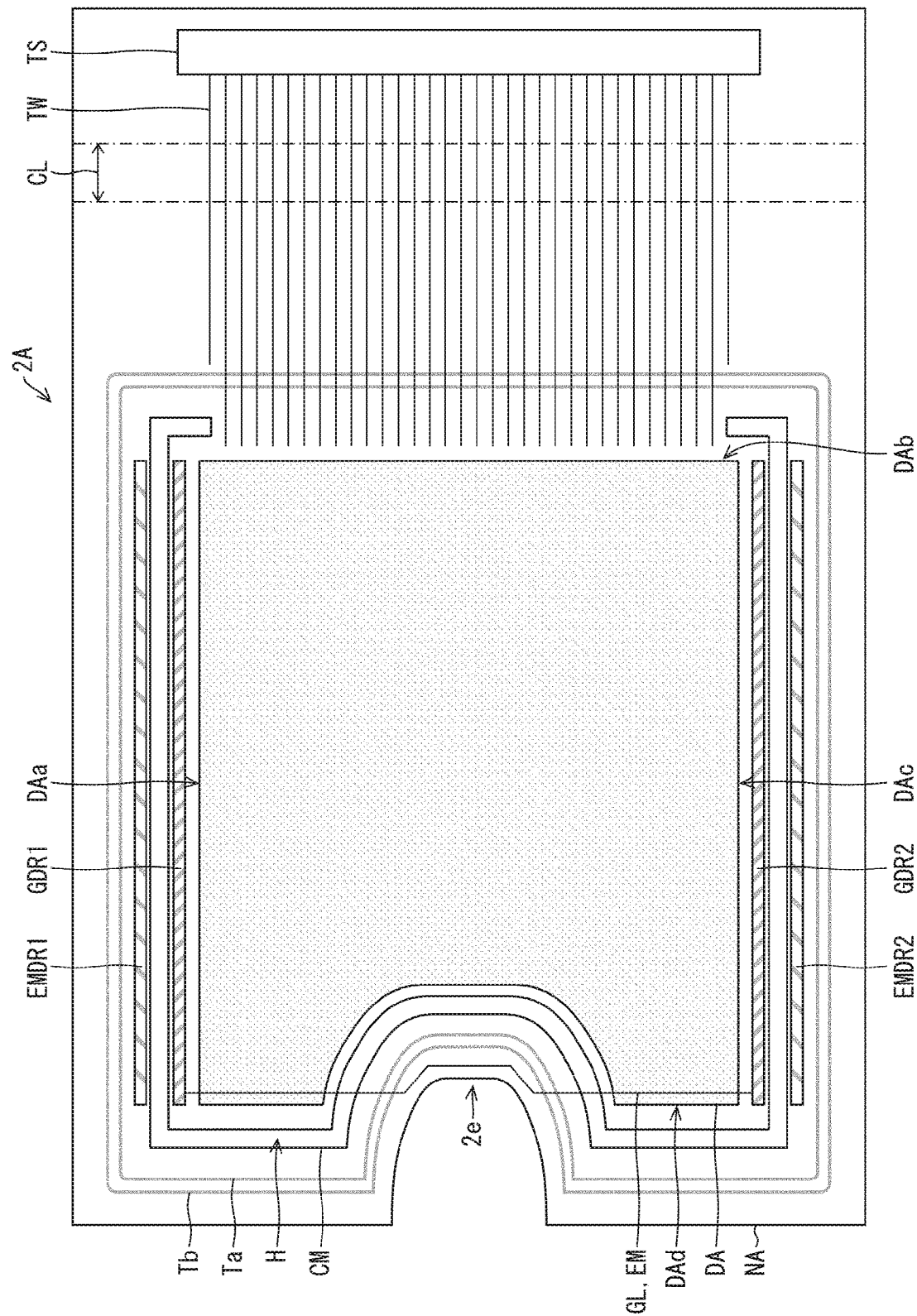
FIG. 11 is a plan view of a display device according to a second embodiment.

If the display area includes a transformed portion, a wire may be routed along the transformed portion. FIG. 11 is a plan view illustrating a configuration of a display device 2A according to a second embodiment.

The display device 2A includes a transformed portion 2e on the third side DAc of the display area DA. The transformed portion 2e is recessed (notched) from the third side DAc toward the center of the display area DA. Then, the outline of the display device 2 is transformed (recessed toward the center) along the transformed portion 2e of the third side DAc. The slit H between the third side DAc and the outline of the display device 2 is also transformed along the transformed portion 2e of the third side DAc.

In addition, the second conductive layer CM in the transformed portion of the slit H is also transformed along the transformed portion of the slit H.

Then, in the transformed portion 2e of the display area DA, some of the scanning signal lines GL and the light-emission control lines EM provided in the display area DA are curved outside the display area DA along the transformed portion 2e of the display area DA.

Such some scanning signal lines GL and the light-emission control lines EM extend into the display area DA from the scanning signal control driver GDR1 and the light-emitting signal control circuit EMDR1, or from the scanning signal control driver GDR2 and the light-emitting signal control circuit EMDR2, extend out of the display area DA at the transformed portion 2e of the display area DA, run below the slit H and intersect with the slit H and the second conductive layer CM, and curve along the transformed portion of the slit H toward the center of the display area DA. Moreover, the curved scanning signal lines GL and the light-emission control lines EM run below the slit H and intersect with the slit H and the second conductive layer CM, extend into the display area DA at the transformed portion 2e of the display area DA, and extend to the scanning signal control driver GDR2 and the light-emitting signal control circuit EMDR2, or to the scanning signal control driver GDR1 and the light-emitting signal control circuit EMDR1.

As can be seen, the display device 2A is provided with the second conductive layer CM to overlap the slit H, so that the slit H. and the scanning signal lines GL and the light-emission control lines EM can intersect with each other. Such a feature makes it possible to prevent the risk that the voltage to be supplied by the transformed portion 2e is not uniform in an area, of the display area DA, provided through the transformed portion 2e. As a result, even if the transformed portion 2e is provided to the display device 2A, the display device 2A can display images with uniform brightness.

Third Embodiment

Demultiplexers May be Provided Along Two of the Sides of the Display Area.

Figure 12:
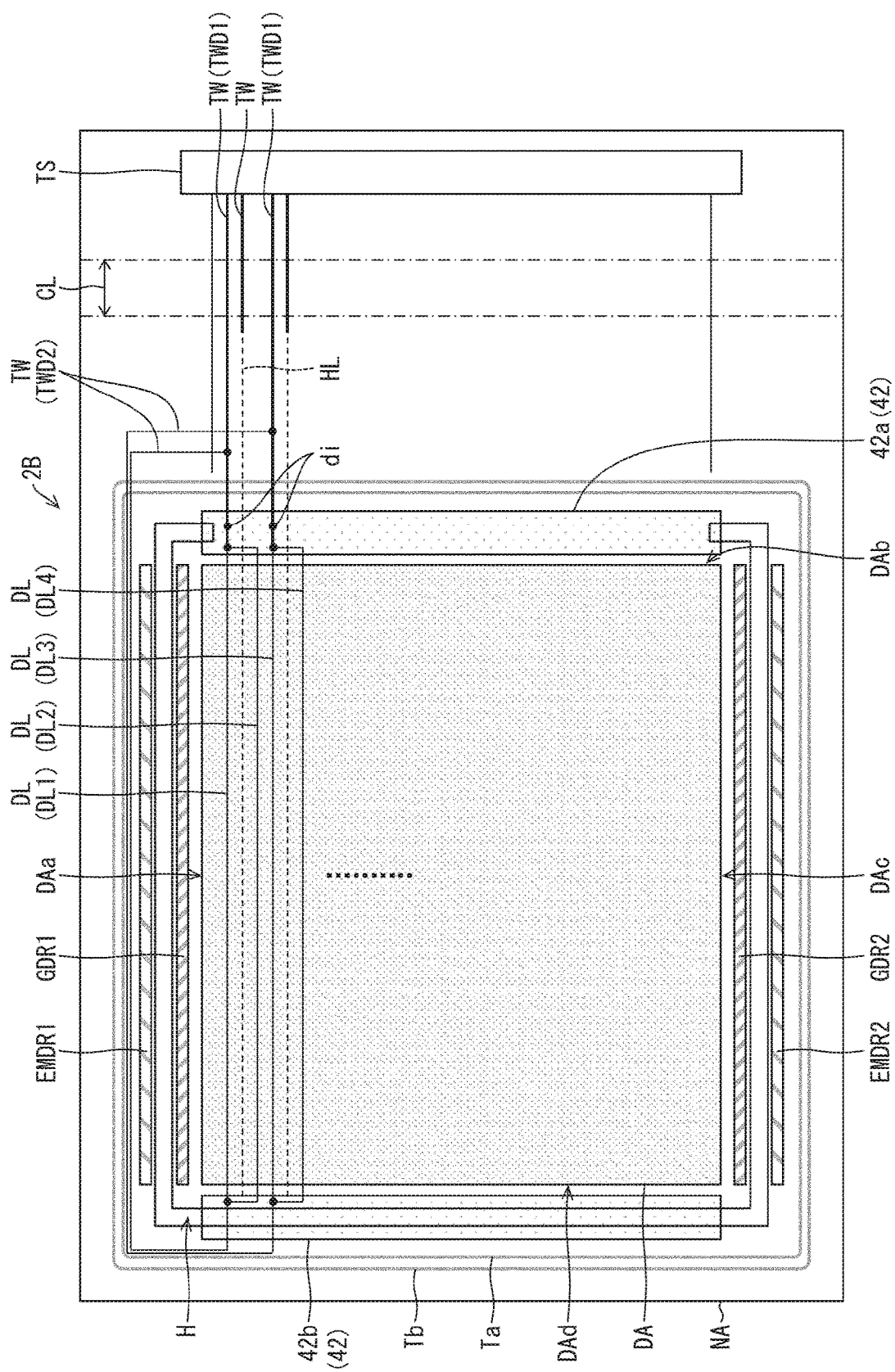
FIG. 12 is a plan view illustrating a configuration of a display device according to a third embodiment.

FIG. 12 is a plan view illustrating a configuration of a display device 2B according to a third embodiment.

In the display device 2B, the non-display area NA is provided with selection output circuits 42a and 42b. The selection output circuit 42a is provided to extend along the second side DAb of the display area DA. The selection output circuit 42b is provided to extend along the fourth side DAb of the display area DA.

Note that the selection output circuits 42a and 42b share the same circuit. If the selection output circuits 42a and 42b are not distinguished from each other, the selection output circuits 42a and 42b are collectively referred to as a selection output circuit 42.

Figure 13:
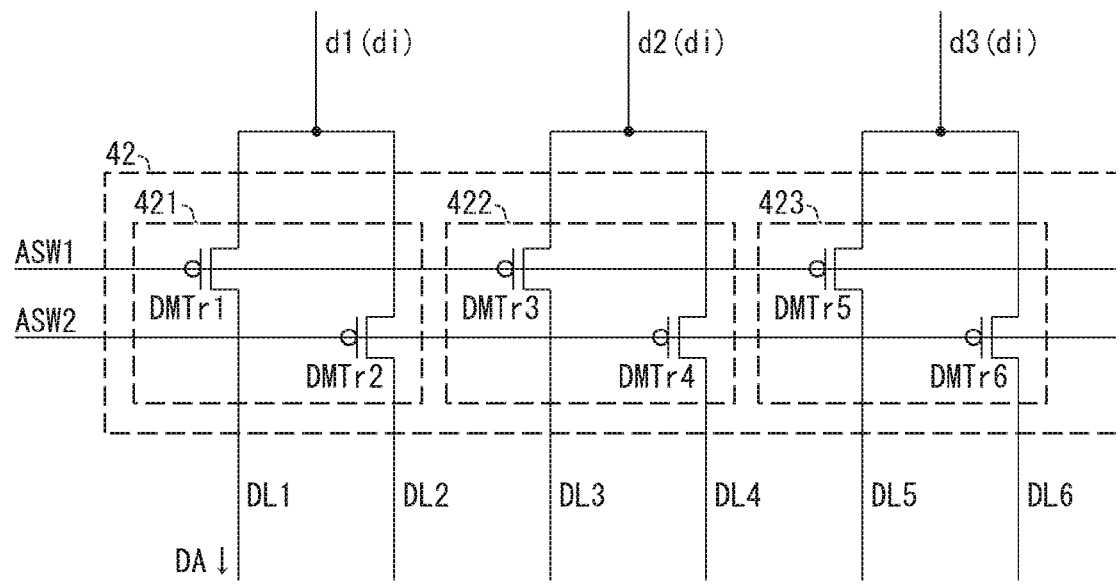
FIG. 13 is a diagram illustrating an example of a configuration of a selection output circuit in the display device according to the third embodiment.

FIG. 13 is a diagram illustrating an example of a configuration of the selection output circuit 42. The selection output circuit 42 includes a plurality of demultiplexers 421, 422, 423 . . . . Each of the demultiplexers 421, 422, 423 . . . combines a plurality of data signal lines provided in the display area DA into one data signal main line di.

The example illustrated in FIG. 13 shows that each of the demultiplexers 421, 422, 423 . . . combines a pair of neighboring data signal lines DL, such as for RG, BR, and GB, into one data signal main line di.

The demultiplexer 421 includes: data signal lines DL1 and DL2 into which the data signal main line d1 (di) branches out; a demultiplexer transistor DMTr1 provided to the data signal line DL1; and a demultiplexer transistor DMTr2 provided to the data signal line DL2. The demultiplexer 422 includes: data signal lines DL3 and DL4 into which the data signal main line d2 (di) branches out; a demultiplexer transistor DMTr3 provided to the data signal line DL3; and a demultiplexer transistor DMTr4 provided to the data signal line DL4. The demultiplexer 423 includes: data signal lines DL5 and DL6 into which the data signal main line d3 (di) branches out; a demultiplexer transistor DMTr5 provided to the data signal line DL5; and a demultiplexer transistor DMTr6 provided to the data signal line DL6. The same goes for the other demultiplexers.

Then, a control signal line ASW1 is connected in common to the demultiplexer transistors DMTr1, DMTr3, DMTr5 . . . each provided to one of a corresponding pair of the data signal lines. A control signal line ASW2 is connected in common to the demultiplexer transistors DMTr2, DMTr4, DMTr6 . . . each provided to another one of a corresponding pair of the data signal lines.

A control signal (ASW) from these control signal lines ASW1 and ASW2 switches ON and OFF of the demultiplexer transistors DMTr1, DMTr3, DMTr5 . . . , and the demultiplexer transistors DMTr2, DMTr4, DMTr6 . . . . Such a feature allows for switching between an active state and an inactive state of the data signal lines DL1, DL3, DL5 . . . , and the data signal lines DL2, DL4, DL6 . . . , thereby switching ON and OFF of supplying the light-emitting elements with the data signal voltages that are supplied from the data signal main lines di.

Figure 14:
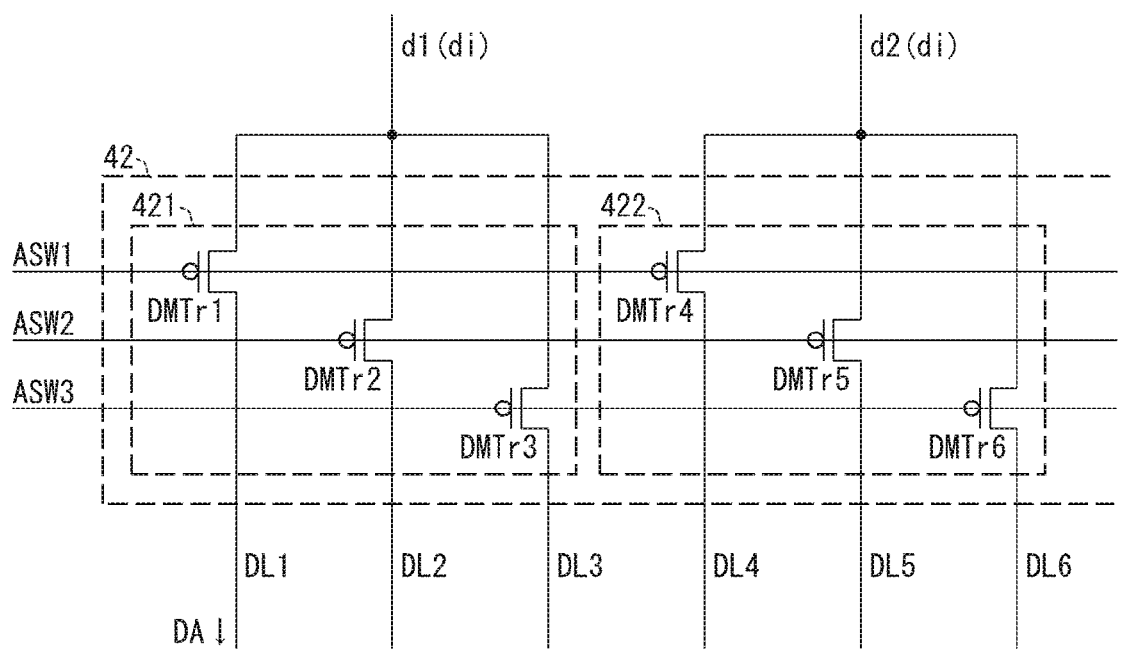
FIG. 14 is a diagram illustrating another example of a configuration of the selection output circuit in the display device according to the third embodiment.

Alternatively, the selection output circuit 42 includes a plurality of demultiplexers illustrated in FIG. 14. FIG. 14 is a diagram illustrating another example of a configuration of the selection output circuit in the display device according to the third embodiment.

The example illustrated in FIG. 14 shows that each of the demultiplexers 421, 422 . . . combines neighboring three of data signal lines DL, such as for RGB, into one data signal main line di.

The demultiplexer 421 includes: data signal lines DL1, DL2, and DL3 into which the data signal main line d1 (di) branches out; a demultiplexer transistor DMTr1 provided to the data signal line DL; a demultiplexer transistor DMTr2 provided to the data signal line DL2; and a demultiplexer transistor DMTr3 provided to the data signal line DL3. The demultiplexer 422 includes: data signal lines DL4, DL5, and DL6 into which the data signal main line d2 (di) branches out; a demultiplexer transistor DMTr4 provided to the data signal line DL4; a demultiplexer transistor DMTr5 provided to the data signal line DL5; and a demultiplexer transistor DMTr6 provided to the data signal line DL6. The same goes for the other demultiplexers.

Then, a control signal line ASW1 is connected in common to the demultiplexer transistors DMTr1, DMTr4 . . . each provided to one of the data signal lines DL1, DL4 . . . included in the data signal lines and connected to light-emitting elements of a single color (e.g., red). A control signal line ASW2 is connected in common to the demultiplexer transistors DMTr2, DMTr5 . . . each provided to one of the data signal lines DL2, DL5 . . . included in the data signal lines and connected to light-emitting elements of another single color (e.g., green). A control signal line ASW3 is connected in common to the demultiplexer transistors DMTr3, DMTr6 . . . each provided to one of the data signal lines DL3, DL6 . . . included in the data signal lines and connected to light-emitting elements of still another single color (e.g., blue).

A control signal (ASW) from these control signal lines ASW1, ASW2, and ASE3 switches ON and OFF of the demultiplexer transistors DMTr1, DMTr4, . . . , the demultiplexer transistors DMTr2, DMTr5, . . . , and the demultiplexer transistors DMTr3, DMTr6 . . . . Such a feature allows for switching between an active state and an inactive state of the data signal lines DL1, DL4, . . . , the data signal lines DL2, DL5, . . . , and the data signal lines DL3, DL6, . . . , thereby switching ON and OFF of supplying the light-emitting elements with the data signal voltages that are supplied from the data signal main lines di.

As illustrated in FIG. 12, the display device 2B includes as the routed wires TW: a first routed wire TWD1 for supplying a data signal voltage to a data signal main line di provided to the selection output circuit 42a; and a second routed wire TWD2 for supplying a data signal voltage to a data signal main line di provided to the selection output circuit 42b.

The first routed wire TWD1 has one end connected to the data driver of the terminal TS and another end electrically connected to the data signal main line di provided to the selection output circuit 42a.

The second routed wire TWD2 intersects with the slit H, and is electrically connected to the data line DL of the display area DA.

The second routed wire TWD2 is connected to, and branches off from, the first routed wire TWD1, and extends along the first side DAa or the third side DAc of the display area DA. Then, the other end of the second routed wire TWD2 is electrically connected to the data signal main line di provided to the selection output circuit 42a.

The first routed wire TWD1 and the second routed wire TWD2 are routed, using the first wire TWS and the wire TWG of the first metal layer.

In the display device 2B, the first routed wire TWD1 and the second routed wire TWD2 can be provided below the slit H, using the wire TWG of the first metal layer. Hence, if the selection output circuit 42a is provided to face the first side DAa of the display area DA, and furthermore, the selection output circuit 42b is provided to face the fourth side DAd of the display area DA, the first routed wire TWD1 and the second routed wire TWD2 can be provided while effects of noise are reduced.

Other Displays

The displays (display devices) according to the first to third embodiments shall not be limited to any particular ones as long as the displays are display panels including display elements. The display elements have brightness and transmittance controlled by current. The display elements to be controlled by current are included in, for example: an organic electro-luminescence (EL) display including an organic light emitting diode (OLED); an EL display such as an inorganic EL display including an inorganic light-emitting diode; or a quantum dot light-emitting-diode (QLED) display including a QLED.

SUMMARY

A display device according to a first aspect of the disclosure includes: a display area including a plurality of sub-pixels each of which has a sub-pixel circuit including a transistor; and a non-display area that is a non-formation area disposed around the display area and having an end on which a terminal is formed. The display area includes: a first metal layer including an electrode positioned in a lower layer of the sub-pixel circuit; a first inorganic insulating film formed above the first metal layer; a second metal layer formed above the first inorganic insulating film, and including an electrode above the first metal layer, the electrode being included in electrodes in the sub-pixel circuit; a second inorganic insulating film formed above the second metal layer; a first electrode formed above the second inorganic insulating film, the first electrode being included in the electrodes in the sub-pixel circuit, and formed above the second metal layer, and being shaped into an island for each of the sub-pixels; an organic insulating film formed above the second inorganic insulating film to cover an edge of the first electrode, and exposing the first electrode; a light-emitting layer formed above the first electrode; and a second electrode formed across the light-emitting layer from the first electrode, the second electrode being formed across the sub-pixels. The non-display area includes: a slit formed in the edge cover to partially surround an outer periphery of the display area; a first conductive layer formed in the same layer as, and separated from, the first electrode, the first conductive layer being in contact with the second electrode at the slit; a second conductive layer formed in the second metal layer, and provided to overlap the slit across from the second inorganic insulating film; and a plurality of routed wires including a wire formed in the first metal layer. The routed wires extend from the non-display area to the display area to intersect with the first conductive layer and the second conductive layer at the slit, and are electrically connected to a wire of the display area, and at the slit, the routed wires overlap the first conductive layer across from the first inorganic insulating film, the second conductive layer, and the second inorganic insulating film.

In the above aspect of the display device according to a second aspect of the disclosure, the display area may include: a plurality of data lines and a plurality of high-level power source lines extending in a column direction; and a plurality of scanning signal lines and a plurality of light-emission control lines extending in a row direction, the scanning signal lines and the light-emission control lines may be formed in the first metal layer, and the data lines and the high-level power source lines may be formed in the same layer as the first electrode.

In the above aspects of the display device according to a third aspect of the disclosure, the routed wires may be electrically connected to opposing ends of the data lines.

In the above aspects of the display device according to a fourth aspect of the disclosure, the second conductive layer may be supplied with a low-level power source voltage.

In the above aspects of the display device according to a fifth aspect of the disclosure, the second conductive layer may be connected, to a wire supplied with the low-level power source voltage, opposite the display area and in a position in which the slit is formed.

In the above aspects of the display device according to a sixth aspect of the disclosure, each of the routed wires connected to the second conductive layer may have one end connected to a low-level power source through the terminal, and an other end connected to the second conductive layer.

In the above aspects of the display device according to a seventh aspect of the disclosure, the non-display area may include across from the slit: a scanning signal control driver which controls to drive the scanning signal lines; and a light-emitting signal control circuit which controls to drive the light-emission control lines, and the scanning signal control driver may be positioned closer to the display area than to the light-emitting signal control circuit.

In the above aspects of the display device according to an eighth aspect of the disclosure, the routed wires may intersect with the slit, and transmit to the light-emission control lines a drive signal output from the light-emitting signal control circuit.

In the above aspects of the display device according to a ninth aspect of the disclosure, the second conductive layer may be supplied with a high-level power source voltage.

In the above aspects of the display device according to a tenth aspect of the disclosure, the second conductive layer may face at least a side, of the display area, away from the terminal, and each of the high-level power source lines may extend from the display area, across the side, of the display area, away from the terminal, and into the second conductive layer, so as to connect to the second conductive layer.

The display device, in the above aspects, according to an eleventh aspect of the disclosure may further include a third conductive layer formed between the second conductive layer and the side, of the display area, away from the terminal, the third conductive layer being formed of the same material as, and in the same layer as, the first electrode, wherein the high-level power source line, which extends from the display area, across the side, of the display area, away from the terminal, and into the second conductive layer, may connect to the third conductive layer through a contact hole provided to the second inorganic film.

In the above aspects of the display device according to a twelfth aspect of the disclosure, when a length in a direction away from the display area is determined as a width, the width of the first conductive layer may be greater than the width of the slit, and may be smaller than the width of the second conductive layer.

In the above aspects of the display device according to a thirteenth aspect of the disclosure, the non-display area may include a selection output circuit including a plurality of demultiplexers each combining a plurality of data signal lines, provided in the display area, into one data signal main line. The selection output circuit may be provided along a side, of the display area, extending in a direction intersecting with the data signal lines.

In the above aspects of the display device according to a fourteenth aspect of the disclosure, the selection output circuit may include: a first selection output circuit disposed to face a side, of the display area, close to the terminal; and a second selection output circuit disposed to face the side, of the display area, away from the display area.

In the above aspects of the display device according to a fifteenth aspect of the disclosure, the non-display area may include a data driver which controls to drive each of the data signal lines, the routed wires may include a first routed wire and a second routed wire electrically connected to the data driver, the first routed wire may be electrically connected to the one data signal main line of the demultiplexers included in the first selection output circuit, and the second routed wire may intersect with the slit, and may be connected to the data signal line of the display area.

The invention claimed is:

1. A display device, comprising: a display area including a plurality of sub-pixels each of which has a sub-pixel circuit including a transistor; and a non-display area that is a non-formation area disposed around the display area and having an end on which a terminal is formed,
    the display area including:
        a first metal layer including an electrode positioned in a lower layer of the sub-pixel circuit;
        a first inorganic insulating film formed above the first metal layer;
        a second metal layer formed above the first inorganic insulating film, and including an electrode above the first metal layer, the electrode being included in electrodes in the sub-pixel circuit;
        a second inorganic insulating film formed above the second metal layer;
        a first electrode formed above the second inorganic insulating film, the first electrode being included in the electrodes in the sub-pixel circuit, and formed above the second metal layer, and being shaped into an island for each of the sub-pixels;
        an organic insulating film formed above the second inorganic insulating film to cover an edge of the first electrode, and exposing the first electrode;
        a light-emitting layer formed above the first electrode; and
        a second electrode formed across the light-emitting layer from the first electrode,
        the second electrode being formed across the sub-pixels, and the non-display area including:
        a slit formed in an edge cover to partially surround an outer periphery of the display area;
        a first conductive layer formed in the same layer as, and separated from, the first electrode, the first conductive layer being in contact with the second electrode at the slit;
        a second conductive layer formed with the second metal layer, and provided to overlap the slit across from the second inorganic insulating film; and
        a plurality of routed wires including a wire formed in the first metal layer,
        the routed wires extending from the non-display area to the display area to intersect with the first conductive layer and the second conductive layer at the slit, and being electrically connected to a wire of the display area, and
        at the slit, the routed wires overlapping the first conductive layer across from the first inorganic insulating film, the second conductive layer, and the second inorganic insulating film.

2. The display device according to claim 1, wherein
the display area includes: a plurality of data lines and a plurality of high-level power source lines extending in a column direction; and a plurality of scanning signal lines and a plurality of light-emission control lines extending in a row direction,
the scanning signal lines and the light-emission control lines are formed in the first metal layer, and
the data lines and the high-level power source lines are formed in the same layer as the first electrode.

3. The display device according to claim 2, wherein
the non-display area includes a selection output circuit including a plurality of demultiplexers each combining a plurality of data signal lines, provided in the display area, into one data signal main line, the selection output circuit being provided along a side, of the display area, extending in a direction intersecting with the data signal lines.

4. The display device according to claim 3, wherein
the selection output circuit includes: a first selection output circuit disposed to face a side, of the display area, close to the terminal; and a second selection output circuit disposed to face the side, of the display area, away from the display area.

5. The display device according to claim 4, wherein
the non-display area includes a data driver configured to control to drive each of the data signal lines,
the routed wires include a first routed wire and a second routed wire electrically connected to the data driver,
the first routed wire is electrically connected to the one data signal main line of the demultiplexers included in the first selection output circuit, and
the second routed wire intersects with the slit, and is connected to the data signal line of the display area.

6. The display device according to claim 2, wherein
the routed wires are electrically connected to opposing ends of the data lines.

7. The display device according to claim 6, wherein
the second conductive layer is supplied with a low-level power source voltage.

8. The display device according to claim 7, wherein
the second conductive layer is supplied with a high-level power source voltage.

9. The display device according to claim 7, wherein
the second conductive layer faces at least a side, of the display area, away from the terminal, and
each of the high-level power source lines extends from the display area, across the side, of the display area, away from the terminal, and into the second conductive layer, so as to connect to the second conductive layer.

10. The display device according to claim 9, further comprising
a third conductive layer formed between the second conductive layer and the side, of the display area, away from the terminal, the third conductive layer being formed of the same material as, and in the same layer as, the first electrode, wherein
the high-level power source line, which extends from the display area, across the side, of the display area, away from the terminal, and into the second conductive layer, connects to the third conductive layer through a contact hole provided to the second inorganic film.

11. The display device according to claim 7, wherein
the second conductive layer is connected, to a wire supplied with the low-level power source voltage, opposite the display area and in a position in which the slit is formed.

12. The display device according to claim 11, wherein
each of the routed wires connected to the second conductive layer has one end connected to a low-level power source through the terminal, and an other end connected to the second conductive layer.

13. The display device according to claim 12, wherein
the non-display area includes across from the slit: a scanning signal control driver configured to control to drive the scanning signal lines; and a light-emitting signal control circuit configured to control to drive the light-emission control lines, and
the scanning signal control driver is positioned closer to the display area than to the light-emitting signal control circuit.

14. The display device according to claim 13, wherein
the routed wires intersect with the slit, and transmit to the light-emission control lines a drive signal output from the light-emitting signal control circuit.

15. The display device according to claim 1, wherein
when a length in a direction away from the display area is determined as a width,
the width of the first conductive layer is greater than the width of the slit, and is smaller than the width of the second conductive layer.

* * * * *